(12) United States Patent
Kuo et al.

(10) Patent No.: US 8,081,506 B2
(45) Date of Patent: Dec. 20, 2011

(54) AMORPHOUS SEMICONDUCTOR THRESHOLD SWITCH VOLATILE MEMORY CELL

(75) Inventors: Charles C. Kuo, Union City, CA (US); Derchang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 12/637,358

(22) Filed: Dec. 14, 2009

(65) Prior Publication Data
US 2011/0141798 A1    Jun. 16, 2011

(51) Int. Cl.
*G11C 11/00*    (2006.01)

(52) U.S. Cl. ............... 365/163; 365/230.09; 365/230.01

(58) Field of Classification Search .................. 365/163, 365/230.09, 230.01
See application file for complete search history.

(56) References Cited

U.S. PATENT DOCUMENTS

| 2008/0117669 A1* | 5/2008 | Fuji et al. ........................ 365/163 |
| 2009/0067229 A1* | 3/2009 | Kang et al. ..................... 365/163 |

* cited by examiner

*Primary Examiner* — Thong Q Le
(74) *Attorney, Agent, or Firm* — Trop, Pruner & Hu, P.C.

(57) ABSTRACT

A voltage memory switch may be formed of an amorphous semiconductor threshold switch and a select device. The amorphous threshold switch may be latched into one of two different current conducting levels. Then, in some embodiments, a relatively dense memory array can be achieved by maintaining an appropriate bias on the cell to prevent it from losing the programmed state.

20 Claims, 2 Drawing Sheets

AMORPHOUS SEMICONDUCTOR THRESHOLD SWITCH VOLATILE MEMORY CELL

BACKGROUND

This relates generally to semiconductor memories used to store information.

An amorphous semiconductor threshold switch is a device that includes an amorphous layer between a pair of electrodes. The amorphous layer generally remains in the amorphous state at all conditions. An amorphous semiconductor threshold switch exhibits S-shaped threshold switch current-voltage characteristics.

One type of amorphous semiconductor threshold switch is called an ovonic threshold switch using a chalcogenide amorphous material. An ovonic threshold switch remains in an amorphous state which distinguishes it from an ovonic memory, which generally changes between amorphous and crystalline states.

In one implementation of an ovonic memory, an ovonic memory is used in series with an ovonic threshold switch. In such case, the ovonic threshold switch operates as the select device for the ovonic memory.

Another example of an amorphous semiconductor threshold switch is an amorphous silicon threshold switch.

DETAILED DESCRIPTION

Figure 1:
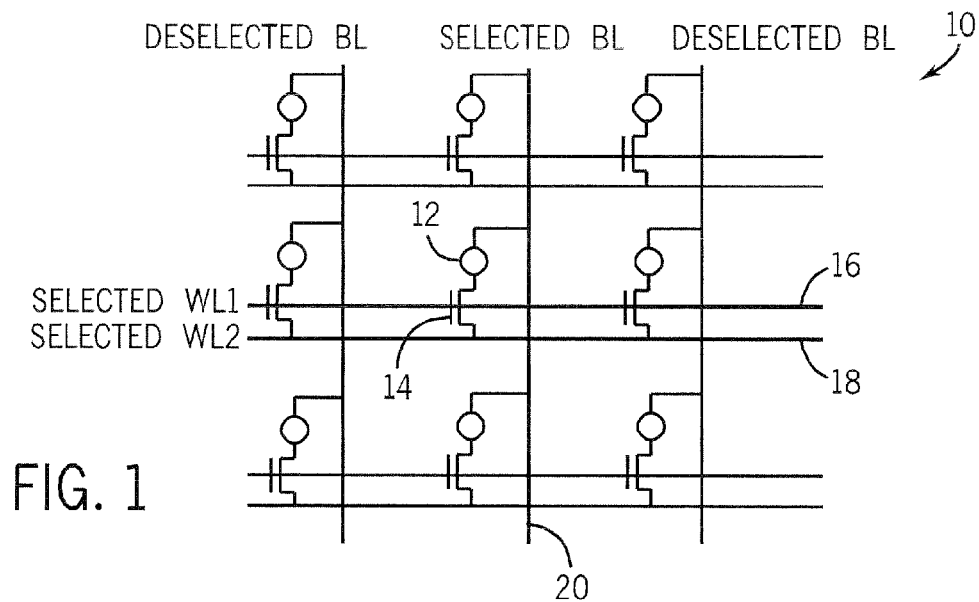
FIG. 1 is a schematic depiction for one embodiment of the present invention.

A volatile memory array 10, shown in FIG. 1, may include a plurality of cells. Each cell may include an amorphous semiconductor threshold switch 12 in series with a select device 14. In one embodiment, the select device may be a conventional N channel MOS transistor, but other select devices may be used as well.

In one embodiment, the amorphous semiconductor threshold switch 12 can be made of a chalcogenide alloy that does not exhibit an amorphous to crystalline phase change and which undergoes rapid, electric field initiated change in electrical conductivity that persists only so long as a holding voltage is present. Other amorphous semiconductor threshold switches may also be used.

The ovonic threshold switch is either "off" or "on" depending on the amount of voltage potential applied across the memory cell, and more particularly whether the current through the switch exceeds its threshold current or voltage, which then triggers the device into the on state. The off state may be a substantially electrically nonconductive state and the on state may be a substantially conductive state, with less resistance than the off state.

In the on state, the voltage across the ovonic threshold switch is equal to its holding voltage $V_H$ plus IxRon, where Ron is the dynamic resistance from the extrapolated X-axis intercept, $V_H$. For example, an ovonic threshold switch may have a threshold voltage and, if a voltage potential less than the threshold voltage of the switch is applied across the switch, then the switch may remain "off" or in a relatively high resistive state so that little or no electrical current passes through the switch. Alternatively, if a voltage potential greater than the threshold voltage is applied across the switch, then the switch may "turn on," i.e., operate in a relatively low resistive state so that electrical current passes through the memory cell. In other words, the ovonic threshold switch may be in a substantially electrically nonconductive state if less than a predetermined voltage potential, e.g., the threshold voltage, is applied across select devices. The ovonic threshold switch may be in a substantially conductive state if greater than the predetermined voltage potential is applied across the switch.

In one embodiment, the ovonic threshold switch may comprise a switching material such as, for example, a chalcogenide alloy. The switching material of the switch may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with the holding voltage) by application of a predetermined electrical current or voltage potential. In this embodiment, the ovonic threshold switch may be a two terminal device that may have a current-voltage (I-V) characteristic similar to a phase change memory element that is in the amorphous state. However, unlike a phase change memory element, the switching material of the ovonic threshold switch may not change phase. That is, the switching material of the ovonic threshold switch may not be a programmable material. For example, the switching material of the ovonic threshold switch may remain permanently amorphous and the I-V characteristic may remain the same throughout the operating life.

In the low voltage or low electric field mode, i.e., where the voltage applied across the switch is less than a threshold voltage, the switch may be "off" or nonconducting, and exhibit a relatively high resistance, e.g., greater than about 10 megaOhms. The switch may remain in the off state until a sufficient voltage, e.g., a threshold voltage is applied, or a sufficient current is applied, e.g., a threshold current, that may switch the device to a conductive, relatively low resistance on state. After a voltage potential of greater than about a threshold voltage is applied across the switch, the voltage potential across the switch may drop ("snapback") to a holding voltage potential. Snapback may refer to the voltage difference between a threshold voltage and a holding voltage.

In the on state, the voltage potential across the switch may remain close to the holding voltage as current passing through select device is increased. The switch may remain on until the current through it drops below a holding current. Below this value, the switch may turn off and return to a relatively high resistance, nonconductive off state until the threshold voltage and current are exceeded again.

The threshold switch 12 may be connected, on one end, to a bitline 20 and, on the other end, to the select device 14. The select device 14, in turn, has its gate coupled to a first word line 16. Its source is coupled to a second word line 18. Thus, the word line 16 controls the gate potential of the select device and the word line 18 controls its source potential.

The array 10 may include any number of parallel bitlines 20 arranged generally perpendicularly to any number of parallel word lines 16 and 18. Thus, the array forms a cross point memory array. In some embodiments, a very dense array can be achieved, for example, in some embodiments, with a size smaller than a conventional six transistor static random access memory cell lay out.

To write a "one" state, the voltage drop across the selected threshold switch 12 exceeds its threshold voltage. To write a "zero" state, this voltage drop is reduced below the holding voltage of the ovonic threshold switch.

During writing, the gate voltage of the select device 14 is such that the resistance of the select device is less than the resistance of the ovonic threshold switch. This may ensure that most of the column voltage drops across the ovonic threshold switch. A negative substrate bias can also be used with an NMOS select transistor, if a negative voltage is passed from its source side. This may avoid forward biasing the source-body junction.

There are other ways for writing such a cell. For example, to write a "zero," the select transistor gate voltage can be reduced such that the cell current falls below the holding current of the ovonic threshold switch. Thus, a "zero" is written across an entire row or array block before a "one" can be written.

To read the voltage across the selected ovonic threshold switch, the switch is maintained between its holding voltage and its threshold voltage. The gate voltage of the select device can be raised to create a larger difference in read current between the zero and one states.

A bias voltage is maintained across the ovonic threshold switch in order to maintain the programmed state. This maintenance voltage is above the holding voltage of the ovonic threshold switch and below its threshold voltage. That is, the select transistor conducts enough current so that the current through the ovonic threshold switch is maintained slightly above its threshold current.

The gate voltage of the series select device can clamp currents at lower levels, in order to reduce cell leakage. This current may be maintained higher than the holding current of the ovonic threshold switch. The lower bound of the holding current of the ovonic threshold switch is the ovonic threshold switch sub-threshold current at its holding voltage.

Figure 2:
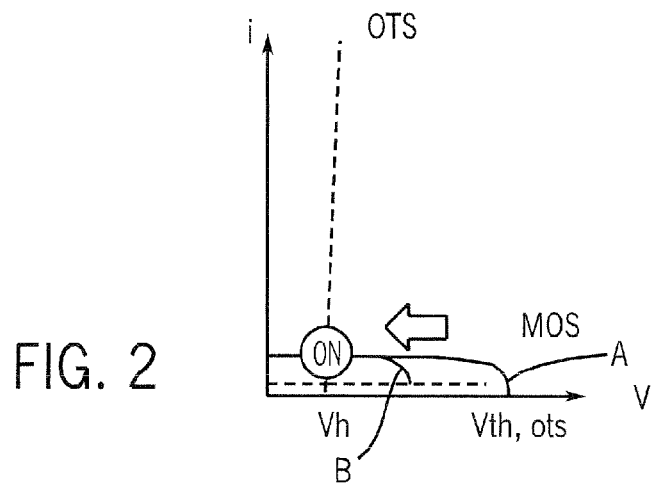
FIG. 2 is a depiction of the current versus voltage characteristics for an ovonic threshold switch and select device during writing according to one embodiment.

Referring to FIG. 2, an exemplary plot of current versus voltage (IV) characteristic is depicted. This is a simplified depiction and is meant to illustrate the concepts described herein. The ovonic threshold switch's IV curve is shown as dashed lines and the characteristics for the MOS select device are shown in solid lines. If the voltage across the selected ovonic threshold switch is greater than its threshold voltage, then a stable DC operating point exists where the select transistor IV characteristic intersects the ovonic threshold switch IV characteristics in its own state. That point is indicated in FIG. 2 by a circle with the word "on" inside it, which corresponds to the programmed "one" state.

Once the ovonic threshold switch is latched in the on state, the column voltage can be reduced, shifting the MOS transistor's IV characteristic to the left, as indicated by the arrow in FIG. 2. Thus, the MOS select transistor can shift from the curve A to the curve B in one embodiment.

Figure 3:
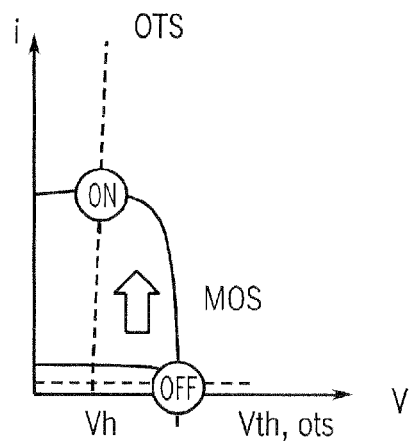
FIG. 3 is a depiction of a current versus voltage curve for the device shown in FIG. 2 during reading in according with one embodiment.

Referring to FIG. 3, illustrating the current versus voltage characteristics for reading in one embodiment, for a larger gate to source voltage on the select device, there is a corresponding larger difference in current between the ovonic threshold switch in its on state versus its off state (indicated by a circle around the word "off" in FIG. 3). Thus, this current difference can be defined as the difference, indicated by the arrow in FIG. 3, between the point indicated as on and the point as indicated as off. In order to read, the ovonic threshold switch is kept between the holding voltage and the threshold voltage, while the gate voltage of the MOS select device is raised to ensure a large difference in read current between the different states.

Thus, to give a more concrete example, to write a zero to a one state, the selected bitline may be held at a level of the ovonic threshold switch's holding voltage plus the voltage V2. In one embodiment, the voltage V2 may be one volt. The selected word line 16 may be held at VG2 which, in one embodiment, may be biased such that the resistance of the select device is less than the resistance of the ovonic threshold switch, to ensure that most of the column voltage falls across the ovonic threshold switch and the current. Further, VG2 is a bias such that the current is larger than the holding current whose lower bound is equal to the sub-threshold current at the ovonic threshold switch holding voltage. The second selected word line 18 may be maintained at a negative voltage V1 which, in one embodiment, may be minus one volt with an ovonic threshold switch having a holding voltage of one volt and a threshold voltage of three volts, as one example. The de-selected bitlines may be held at the holding voltage of the ovonic threshold switch. The de-selected word line 16 may be held at VG2 and the de-selected word lines 18 may be held at ground.

To write a zero in a cell that is currently a one, a selected bitline is held at the holding voltage, the selected word line 16 is held at VG2 and the selected word line 18 may be held at the holding voltage of the ovonic threshold switch. The de-selected bitlines may be held at the holding voltage plus V2. In one embodiment, V2 may be one volt. The de-selected word line 16 may be VG2 and the de-selected word line 18 may be ground.

To maintain the programmed states, the bitlines may be at the holding voltage of the ovonic threshold switch, the word line 16 may be at VG2, and the word lines 18 may be at ground.

During reading, the selected bitline may be at the ovonic threshold switch holding voltage. The word line 16 that is selected may be at VG1, while all the word lines 18 may be at ground. The de-selected bitlines may also be held at the holding voltage of the ovonic threshold switch, while the de-selected word line 16 may be at VG2.

Figure 4:
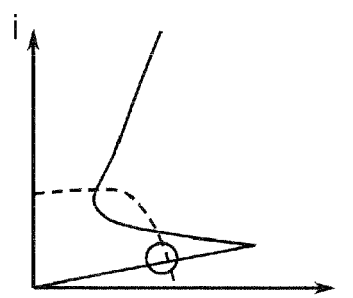
FIG. 4 is a current voltage characteristic for an amorphous semiconductor threshold switch in the reset state about to be read in accordance with one embodiment.
Figure 5:
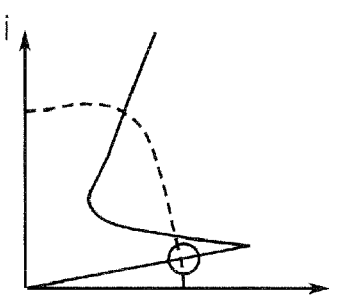
FIG. 5 is a current voltage characteristic for the amorphous semiconductor threshold switch in FIG. 4 after the word line voltage has been increased to read the reset cell in accordance with one embodiment.

Referring to FIG. 4, the current versus voltage characteristic for a cell about to be read in the reset state is indicated. The circle marks the reset state. In response to an increase in the word line voltage, the gate to source voltage on the cell increases, as indicated in FIG. 5, by the increased size of the dotted line path.

Figure 6:
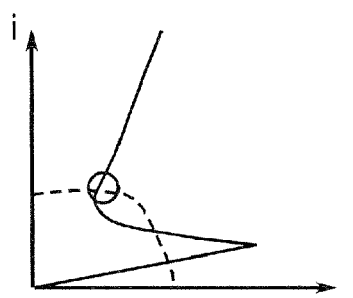
FIG. 6 is a current voltage characteristic for an amorphous semiconductor threshold switch in the set state about to be read in accordance with one embodiment.
Figure 7:
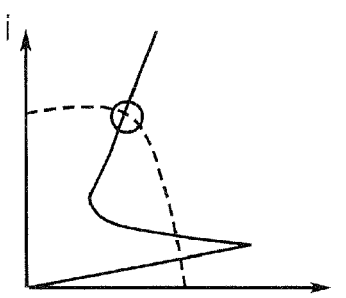
FIG. 7 is a current voltage characteristic for the amorphous semiconductor threshold switch in FIG. 6 after the word line voltage has been increased to read the set cell in accordance with one embodiment.

FIG. 6 corresponds to FIG. 4 in the case where the cell is in the set state. In response to an increase in word line voltage, shown in FIG. 7 in a dotted line, the gate to source voltage is increased. Again, the circle indicates the set state.

Figure 8:
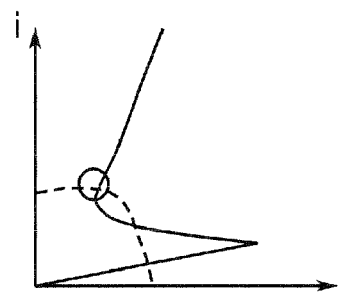
FIG. 8 is a depiction of a set of an amorphous semiconductor threshold switch about to be programmed to the reset state in accordance with one embodiment.
Figure 9:
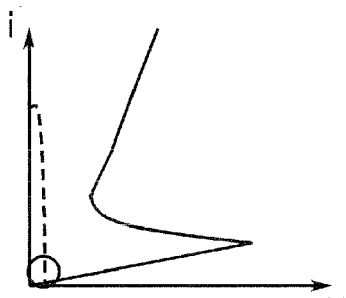
FIG. 9 is a current voltage characteristic for the amorphous semiconductor threshold switch of FIG. 8 after it has been programmed to the reset state in accordance with one embodiment.

Turning next to FIG. 8, it shows a selected cell in the set state about to be written to the reset state. Thus, it corresponds generally to FIG. 6. In order to program the cell, the word line voltage is increased, as indicated in a dotted line. The bitline voltage drops to a low voltage and the cell is written to the reset state, as indicate in FIG. 9. The reset state is indicated by the circle.

Figure 10:
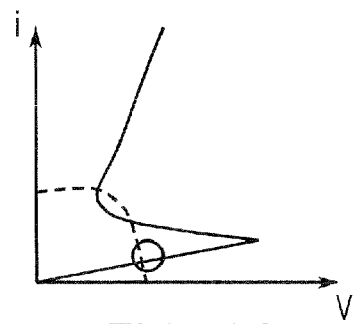
FIG. 10 is a current voltage characteristic for a reset cell reset amorphous semiconductor threshold switch in accordance with one embodiment.
Figure 11:
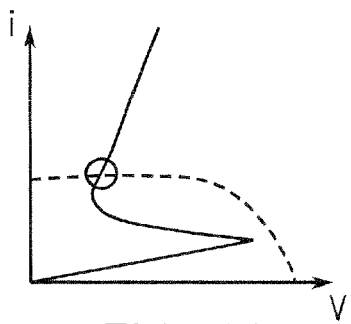
FIG. 11 is a current voltage characteristic for the cell of FIG. 10 after it has been programmed to the set state in accordance with one embodiment.

Turning next to FIG. 10, a cell in the reset state is about to be written to the set state. FIG. 10 corresponds to FIG. 4. In response to an increase in the bitline voltage and a reduction in the word line voltage, the bitline rises to a high voltage in FIG. 11 and the cell is written to the set state. The dotted line shows the increase in the bitline voltage.

The deselected cells may use a voltage drop across the amorphous semiconductor portion of the cell that is less than the threshold (i.e. switching) voltage and above the holding voltage.

In terms of size, a one transistor ovonic threshold switch cell compares favorable to an ovonic memory. This is because the transistor used as the select transistor, in some embodiments of this invention, may be smaller than the select device used in an ovonic memory. That is because the select device in the ovonic memory must deal with the greater current associated with phase transformation of the chalcogenide material. In terms of speed, the volatile memory described herein may be comparable to that of a conventional six transistor standard random access memory.

Thus, comparing volatile memories, the speed of some embodiments of the present invention may be comparable to that of a six transistor static random access memory, but the size of some embodiments of the present invention, using only a single transistor and an ovonic threshold switch, may be considerably smaller than that of standard six transistor static random access memory. Thus, some embodiments of the present invention may provide a volatile memory with comparable speed at much smaller size.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a volatile memory cell including an amorphous semiconductor threshold switch selectively programmable to two different current conducting levels, each representing a different programmed state.

2. The method of claim 1 including forming said cell by forming a series select device and ovonic threshold switch.

3. The method of claim 2 including using an NMOS field effect transistor as the select device.

4. The method of claim 3 including providing a first word line coupled to a gate of said select device and a second word line coupled to a source of said select device.

5. The method of claim 4 including coupling a bitline to one terminal of said switch and coupling a drain of said select device to the other terminal of said switch.

6. The method of claim 5 including adjusting a gate voltage of the select device such that its resistance is less than the resistance of the ovonic threshold switch.

7. The method of claim 5 including, once the switch has latched into an on state, reducing a bitline voltage.

8. The method of claim 1 including biasing said switch to maintain the switch in one of said two different current conducting levels.

9. The method of claim 8 including maintaining a voltage across the threshold switch above its holding voltage and below its threshold voltage.

10. The method of claim 2 including operating said switch at a point where a current voltage characteristic of the select device intersects the current voltage characteristic of the ovonic threshold switch in its on state.

11. A memory comprising:
    an MOS transistor;
    an amorphous semiconductor threshold switch, having two distinct programmable states, coupled to said MOS transistor;
    a first address line coupled to said amorphous semiconductor threshold switch;
    a second address line coupled to a gate of said MOS transistor; and
    a third address line coupled to said MOS transistor.

12. The memory of claim 11 including a plurality of memory cells coupled to said first, second, and third address lines, each cell including only a single MOS transistor and a single ovonic threshold switch.

13. The memory of claim 11 wherein said first address line is a bitline and said second and third address lines are word lines.

14. The memory of claim 13 wherein said third address line is coupled to a source of said MOS transistor and a drain of said MOS transistor is coupled to said amorphous semiconductor threshold switch.

15. The memory of claim 11 wherein said memory is biased above a holding voltage of said amorphous semiconductor threshold switch.

16. A memory comprising:
    a plurality of addressable cells; and
    each of said cells including an amorphous semiconductor threshold switch and a transistor, said switch and transistor coupled in series, said switch having two distinct programmable states.

17. The memory of claim 16 wherein said amorphous semiconductor threshold switch being programmable to one of at least two different states.

18. The memory of claim 16 wherein each of said cells includes a connection to a bitline and a connection to two word lines.

19. The memory of claim 18 wherein said amorphous semiconductor threshold switch is coupled to said bitline and to said transistor, a gate of said transistor coupled to a word line, a source of said transistor coupled to a word line.

20. The memory of claim 16 wherein a selected cell is biased above a holding voltage of its amorphous semiconductor threshold switch.

* * * * *